United States Patent [19]

Cotreay

[11] Patent Number: 5,528,682
[45] Date of Patent: Jun. 18, 1996

[54] DOUBLE DUTY CAPACITOR CIRCUIT AND METHOD

[75] Inventor: Gerald M. Cotreay, Melbourne, Fla.

[73] Assignee: Harris Corporation, Melbourne, Fla.

[21] Appl. No.: 380,410

[22] Filed: Jan. 30, 1995

[51] Int. Cl.⁶ .............................. H04M 1/00; H01P 1/10; H03H 7/00
[52] U.S. Cl. .......................... 379/377; 379/399; 379/382; 333/101; 333/172
[58] Field of Search ..................... 379/399, 400, 379/382, 377, 403, 404, 414, 415, 416, 417, 340, 394, 398; 327/555; 333/172, 101, 132; 361/119, 42; 381/101, 102

[56] References Cited

U.S. PATENT DOCUMENTS

| | | | |
|---|---|---|---|
| 2,208,928 | 7/1940 | Helmert | 379/377 X |
| 3,569,863 | 3/1971 | Cow | 333/172 X |
| 3,582,835 | 6/1971 | Walding | 333/174 |
| 3,750,057 | 7/1973 | Smith . | |
| 4,064,373 | 12/1977 | Pinede et al. . | |
| 4,207,539 | 6/1980 | Minakuchi | 331/1 A |
| 4,656,661 | 4/1987 | Carbrey | 379/399 |
| 4,712,233 | 12/1987 | Kuo | 379/386 |
| 4,723,299 | 2/1988 | Kobayashi | 333/172 X |
| 4,724,407 | 2/1988 | Miura | 333/101 X |
| 4,908,854 | 3/1990 | Löfmark | 379/373 |
| 5,019,794 | 5/1991 | Letessier et al. . | |
| 5,146,384 | 9/1992 | Markovic et al. | 361/119 X |
| 5,202,924 | 4/1993 | Richards, Jr. | 381/13 |
| 5,293,420 | 3/1994 | Nagato | 379/382 |

*Primary Examiner*—Jeffery Hofsass
*Assistant Examiner*—Devendra T. Kumar
*Attorney, Agent, or Firm*—R & K

[57] ABSTRACT

A method and circuit in which two filters connected to different inputs that do not operate at the same time share a common capacitor to thereby reduce the number of capacitors needed for the circuit. A filter that is connected to an input that is not operating may be selectively disabled by connecting a resistor form the disabled filter and the common capacitor to ground when the other input is being operated. The method and circuit find application in a telephone system in which a filter connected to a subscriber line interface circuit (SLIC) and a filter connected to a telephone system circuit that does not operate at the same time as the SLIC share a common capacitor.

18 Claims, 2 Drawing Sheets

DOUBLE DUTY CAPACITOR CIRCUIT AND METHOD

BACKGROUND OF THE INVENTION

The present invention relates to methods and circuits for selectively enabling one of two filters, and more particularly to a method and circuit for a telephone system in which two filters connected to different inputs share a common capacitor to thereby reduce the number of capacitors needed for the telephone system.

Many systems may include passive filters that have resistors and capacitors, such as low pass and band pass filters. For example, and with reference to FIG. 1, an input 12 may provide a signal to filter 14 having a resistor R1 and a capacitor C1. The input signal is applied between node N1 and ground, and the filtered output appears at node N2. A separate filter 14 has heretofore been required for each input and output pair.

When the system includes an integrated circuit (IC) the resistors in the filters may be integrated into the IC. However, the filters' capacitors, if larger than a few tens of picofarads, are discrete components that are not integrated into the IC Each filter may require one or more such capacitors and thus systems having a plurality of filters each with discrete component capacitors, such as audio frequency circuits in telephone systems, may find that considerable real estate is used by the discrete component capacitors. Further, discrete components may be costly and increase the time needed for assembly.

Some of the systems include a plurality of circuits that are not operated at the same time so that the filter(s) associated with the circuits are not operated at the same time. For example, in a telephone system the ring trip detection circuit (RTDC) and the subscriber line interface circuit (SLIC) are not operated at the same time. The RTDC is connected to a subscriber's telephone line to determine when the telephone has been answered, but is disconnected form the line, and the SLIC is connected to the line, once the telephone has been answered. The SLIC and the RTDC each has a separate low pass filter, and it is desirable to reduce the number of components in the filters.

Accordingly, it is an object of the present invention to provide a novel method and circuit with filters connected to inputs that operate at different times that obviates the problems of the prior art.

It is another object of the present invention to provide a novel method and circuit in which filters connected to inputs that operate at different times share a common capacitor.

It is yet another object of the present invention to provide a novel method and circuit in which two filters share a common capacitor and in which a resistor in one filter and the common capacitor are grounded when the other filter is operating.

It is still another object of the present invention to provide a novel method and circuit in which two filters connected to circuits that do not operate concurrently share a common capacitor and in which a resistor in a filter in the circuit that is not operating is grounded when the other circuit is operating.

It is further object of the present invention to provide a novel method and circuit for operating a telephone system in which a filter in a SLIC and a filter in a RTDC share a common capacitor and in which a resistor in the SLIC filter is grounded to disable the SLIC filter when the RTDC is operating, and in which a resistor in the RTDC filter is grounded to disable the RTDC filter when the SLIC is operating.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

Figure 1:
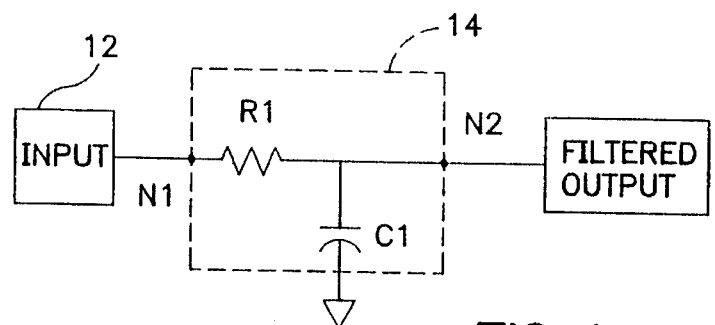
FIG. 1 is a partial circuit diagram of a filter of the prior art.
Figure 2:
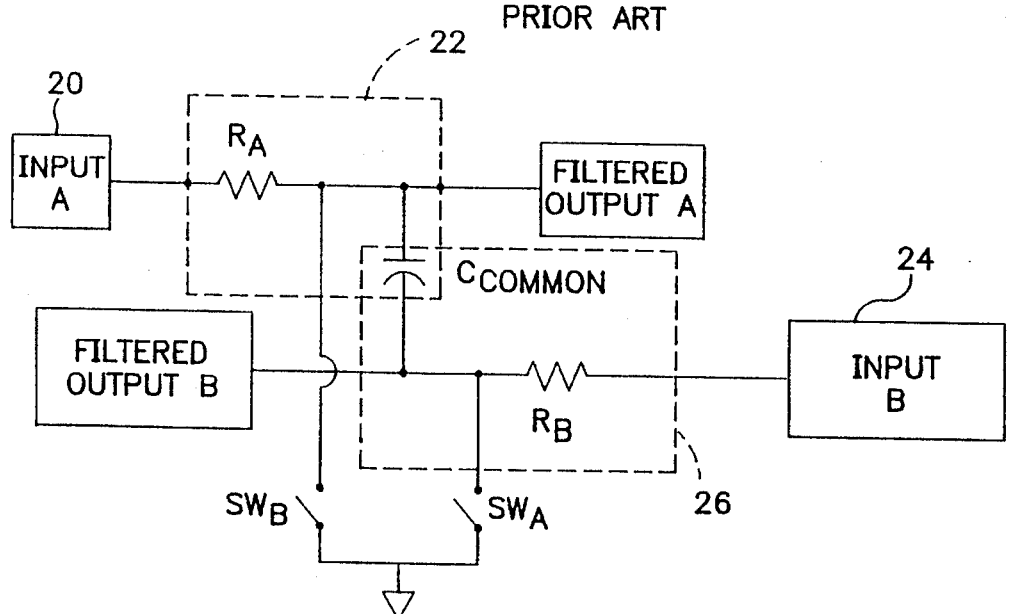
FIG. 2 is a partial circuit diagram of an embodiment of a filter selection circuit of the present invention.

With reference now to FIG. 2, an embodiment of the present invention may include two filters, each connected to a separate input, that share a common capacitor. A first input 20 may provide a signal to first filter 22 that includes resistor $R_A$ and capacitor $C_{COMMON}$. A second input 24 may provide a signal to second filter 26 that includes resistor $R_B$ and the capacitor $C_{COMMON}$. Inputs 20 and 24 do not operate (e.g., provide input signals) at the same time and thus do not provide output signals to their respective outputs at the same time. As illustrated in FIG. 2, the outputs need not be common.

When input 20 is operating and filter 22 is to operate therewith, switch $SW_A$ may be closed and switch $SW_B$ opened. When the switches are in this configuration, resistor $R_B$ is grounded so that filter 26 is disabled, and capacitor $C_{COMMON}$ is grounded so that filter 22 is operable. Conversely, when input 24 is operating and filter 26 is to operate therewith, switch SWB may be closed and switch $SW_A$ opened. Resistor $R_A$ is grounded so that filter 22 is disabled, and capacitor $C_{COMMON}$ is grounded so that filter 26 is operable.

Figure 3:
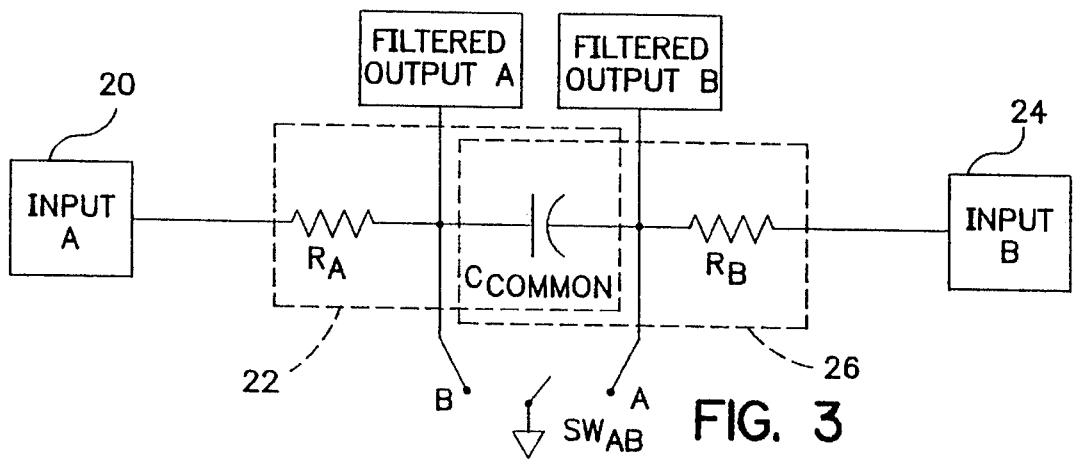
FIG. 3 is a partial circuit diagram of another embodiment of a filter selection circuit of the present invention.

FIG. 3 illustrates another embodiment of the invention in which a double-pole switch $SW_{AB}$ is used (the arrangement of components is depicted differently in FIG. 3 although the components are connected as in the embodiment of FIG. 2).

Figure 4:
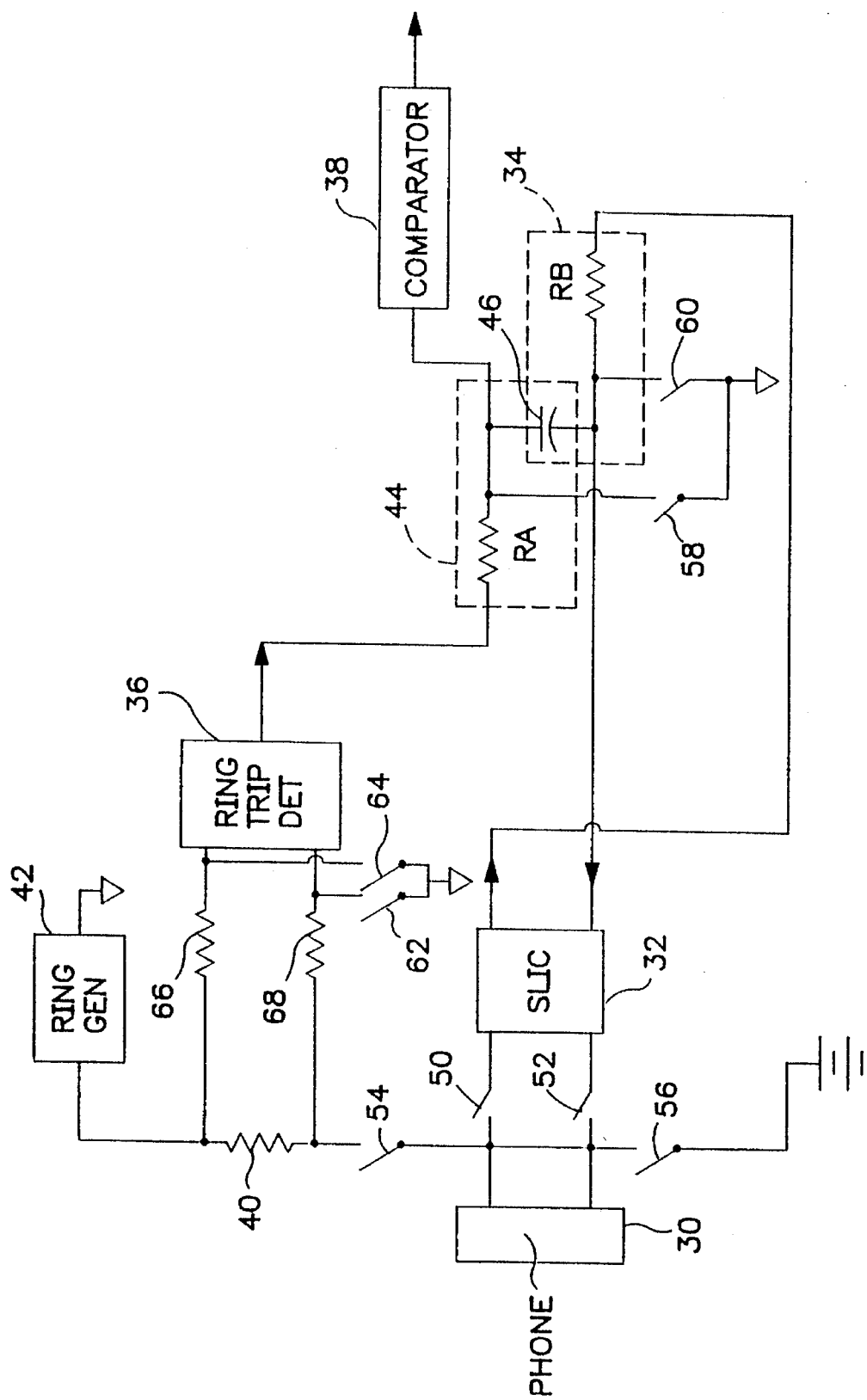
FIG. 4 is a partial circuit diagram of the embodiment of FIG. 2 illustrating application to a telephone system.

With reference now to FIG. 4, the present invention may find application in a telephone system that includes a subscriber telephone 30 connected to a subscriber line interface circuit (SLIC) 32. SLIC 32 connects telephone 30 to a central office and provides a variety of services that are well known in the art and need not be discussed herein. SLIC 32 may include a low pass filter 34 that operates when SLIC 32 is operating. Telephone system also include other circuits, some of which do not operate at the same time as a SLIC. For example, a ring trip detector 36 detects when telephone 30 has been answered by providing to comparator 38 a signal indicative of the voltage (or current) across resistor 40. The voltage (or current) across resistor 40 is form a dc signal from ring generator 42. Telephone 30 has been answered when the dc signal across resistor 40 exceeds a predetermined value. The signal from detector 36 to comparator 38 passes through low pass filter 44.

Each of filters 34 and 44 may include a resistor $R_A$, $R_B$ and may share a common capacitor 46, to thereby reduce the number of capacitors required to operate the telephone system. When SLIC 32 is transmitting an audio frequency signal to telephone 30, switches 50 and 52 are closed connecting SLIC 32 to the telephone line and switches 54 and 56 are open disconnecting ring generator 42 and ring trip detector 36. SLIC 32 may use low pass filter 34 for its battery feed function, while ring trip detector 36 has no need for filter 44. Accordingly, switch 58 is closed to ground resistor $R_A$ and disable filter 44, and to ground common capacitor 46 and enable operation of filter 34.

Conversely, when telephone 30 is being called switches 54 and 56 are closed to connect ring generator 42 and ring trip detector 36 to the telephone line. Switches 50 and 52 are open to disconnect SLIC 32. Ring trip detector 36 uses low pass filter 44 to detect ring trip, while SLIC 32 has no need for filter 34. Accordingly, switch 60 is closed to ground resistor RB and disable filter 34, and to ground common capacitor 46 and enable operation of filter 44. SLIC 32 may include an integrated circuit and switches 58 and 60 may be integrated into the integrated circuit.

With further reference to FIG. 4, further switches 62 and 64 may be added to the ring detector 36 connection to improve isolation of ring generator 42 by shunting resistors 66 and 68 to ground. Ring generator 42 normally provides a ring signal at all times, so that when SLIC 32 is connected to the telephone line and ring trip detector 36 is disconnected, resistors 66 and 68 carry the ring signal to detector 36. Detector 36 will deliver an output of some kind to resistor $R_A$ in filter 44. Even though resistor $R_A$ is grounded by switch 58 during this time, a ring signal may still reach capacitor 46 if switch 58 has a high "on" resistance. When switch 58 has high "on" resistance, the output of filter 44 may not be solidly grounded and resistor $R_A$ could couple some of the ring signal into capacitor 46 and thus into SLIC 32 through filter 34. Switches 62 and 64 present this from happening by shunting resistors 66 and 68 to ground. When detector 36 is being used, switches 62 and 64 are open.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art form a perusal hereof.

What is claimed is:

1. A circuit for selecting a filter comprising:
   a first filter comprising a first resistor and common capacitor, said first filter being connected to a first input;
   a second filter comprising a second resistor and said common capacitor, said second filter being connected to a second input,
   said first and second filters for being operated in separate time periods; and
   a switch for connecting said second resistor and said common capacitor to ground when said first filter is being operated, and for connecting said first resistor and said common capacitor to ground when said second filter is being operated.

2. The circuit of claim 1 wherein said common capacitor has a first terminal connected to said first resistor and a second terminal connected to said second resistor, and wherein said switch connects said second terminal to ground when said first filter is being operated and said switch connects said first terminal to ground when said second filter is being operated.

3. The circuit of claim 1 in a telephone system wherein said first input is a subscriber line interface circuit (SLIC) and said second input is a ring trip detection circuit.

4. The circuit of claim 3 wherein said SLIC comprises an integrated circuit and said switch is a semiconductor device integral with said integrated circuit.

5. The circuit of claim 1 wherein said switch comprises two single-pole switches, each for connecting one of said resistors to ground.

6. The circuit of claim 1 wherein said switch comprises one double-pole switch for alternatively connecting one of said resistors to ground.

7. A circuit for selectively disabling one of two RC filters, each of the two filters being connected to a different one of two inputs that are not operated at the same time, the disabled one of the two filters being connected to the input that is not operating, the circuit comprising:
   a common capacitor shared by the two RC filters that is connected between two resistors, one from each of the two RC filters; and
   a switch connected between ground and a selected one of the two resistors for disabling the one of the filters that is connected to the input that is not operating by grounding the resistor in the disabled filter.

8. The circuit of claim 7 wherein said common capacitor has a first terminal connected to a resistor in a first one of the RC filters and a second terminal connected to a resistor in a second one of the RC filters, and wherein said switch connects said second terminal to ground when the input to said first filter is being operated and connects said first terminal to ground when the input to said second filter is being operated.

9. The circuit of claim 7 in a telephone system wherein one of the two inputs is a subscriber line interface circuit (SLIC) and the other of the two inputs is another telephone system circuit.

10. The circuit of claim 7 wherein the two filters are not connected to a common output.

11. A selection circuit in a telephone system for selectively enabling either a filter connected to a subscriber line interface circuit (SLIC) or a filter connected to another telephone system circuit, the selection circuit comprising:
   a first filter comprising a first resistor and a common capacitor, said first filter being connected to a SLIC;
   a second filter comprising a second resistor and said common capacitor, said second filter being connected to another telephone system circuit; and
   a switch for connecting said second resistor and said common capacitor to ground when the SLIC is being operated, and for connecting said first resistor and said common capacitor to ground when the other telephone system circuit is being operated,
   wherein the SLIC and the other telephone system circuit are operated in separate time periods.

12. The selection circuit of claim 11 wherein said common capacitor has a first terminal connected to said first resistor and a second terminal connected to said second resistor, and wherein said switch connects said second terminal to ground when the SLIC is being operated and said switch connects said first terminal to ground when the other telephone system circuit is being operated.

13. The selection circuit of claim 11 wherein the other telephone system circuit is a ring trip detection circuit.

14. The selection circuit of claim 13 wherein the ring trip detection circuit comprises means for grounding inputs to the ring trip detection circuit when the ring trip detection circuit is not being operated.

15. The selection circuit of claim 11 wherein said first and second filters are low pass filters.

16. A method of operating two filters where each filter is connected to an input that does not operate at the same time as the input connected to the other filter, the method comprising the steps of:

(a) connecting a first resistor in a first of the two filters to a common capacitor, the first filter being connected to a first input, (b) connecting a second resistor in a second of the two filters to the common capacitor so that the two filters share the common capacitor, the second filter being connected to a second input; and (c) switching the second resistor and the common capacitor to ground when the first input is being operated, and switching the first resistor and the common capacitor to ground when the second input is being operated.

17. The method of claim 16 wherein the common capacitor has two terminals, one connected to the first resistor and one connected to the second resistor, and further comprising the step of connecting the second terminal to ground when the first input is being operated and connecting the first terminal to ground when the second input is being operated.

18. A method of selectively disabling one of two RC filters, each of the two filters being connected to one of two inputs, the method comprising the steps of:

(a) connecting a common capacitor that is shared by the two RC filters between two resistors, one from each of the two RC filters; and (b) switchably connecting to ground a selected on of the two resistors and the common capacitor to disable the one of the filters that has its resistor grounded.

* * * * *

UNITED STATES PATENT AND TRADEMARK OFFICE
CERTIFICATE OF CORRECTION

PATENT NO. : 5,528,682
DATED : June 18, 1996
INVENTOR(S) : Gerald M. Cotreau

It is certified that error appears in the above-indentified patent and that said Letters Patent is hereby corrected as shown below:

On the title page, item [19] and

[75] Inventor: Gerald M. Cotreau, Melbourne, Fla.

Signed and Sealed this

Twenty-fourth Day of September, 1996

*Attest:*

BRUCE LEHMAN

*Attesting Officer*     *Commissioner of Patents and Trademarks*

UNITED STATES PATENT AND TRADEMARK OFFICE
CERTIFICATE OF CORRECTION

PATENT NO. : 5,528,682
DATED      : June 18, 1996
INVENTOR(S): Gerald M. Cotreau It is certified that error appears in the above-indentified patent and that said Letters Patent is hereby corrected as shown below:

On the title page, item [19] and
   [75]  Inventor:  Gerald M. Cotreau, Melbourne, Fla.

Signed and Sealed this

Eleventh Day of March, 1997

*Attest:*

BRUCE LEHMAN

*Attesting Officer*       *Commissioner of Patents and Trademarks*